(12) United States Patent
Yamada et al.

(10) Patent No.: US 7,554,163 B2
(45) Date of Patent: Jun. 30, 2009

(54) SEMICONDUCTOR DEVICE (75) Inventors: Takayuki Yamada, Toyama (JP);
Atsuhiro Kajiya, Hyogo (JP); Satoshi Ishikura, Osaka (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 11/481,909

(22) Filed: Jul. 7, 2006

(65) Prior Publication Data
US 2007/0007603 A1    Jan. 11, 2007

(30) Foreign Application Priority Data
Jul. 7, 2005    (JP) .............................. 2005-198328

(51) Int. Cl.
*H01L 29/76* (2006.01)
(52) U.S. Cl. .................. 257/393; 257/391; 257/392; 257/903; 257/E21.661; 257/E27.098; 257/E27.099
(58) Field of Classification Search ......... 365/154–156, 365/230.05; 257/903, 390, 391, E27.098, 257/E27.099, E21.661; 438/128, 129
See application file for complete search history.

(56) References Cited
U.S. PATENT DOCUMENTS

| | | | | |
|---|---|---|---|---|
| 6,347,062 B2 * | 2/2002 | Nii et al. | ................ | 365/230.05 |
| 6,476,424 B1 * | 11/2002 | Ishida | ......................... | 257/206 |
| 6,552,923 B2 * | 4/2003 | Houston | ....................... | 365/154 |
| 6,590,802 B2 * | 7/2003 | Nii | .............................. | 365/156 |
| 6,734,573 B2 * | 5/2004 | Okada | ......................... | 257/376 |
| 6,812,534 B2 * | 11/2004 | Ishigaki et al. | ............... | 257/401 |
| 6,822,300 B2 * | 11/2004 | Nii | .............................. | 257/390 |
| 6,847,542 B2 * | 1/2005 | Yabe | ........................... | 365/154 |
| 6,985,379 B2 * | 1/2006 | Nii | .............................. | 365/154 |
| 7,002,258 B2 * | 2/2006 | Mali et al. | .................. | 257/204 |
| 7,023,056 B2 * | 4/2006 | Liaw | .......................... | 257/369 |
| 7,035,135 B2 * | 4/2006 | Nii | .............................. | 365/154 |
| 7,233,032 B2 * | 6/2007 | Liaw | .......................... | 257/202 |
| 7,271,451 B2 * | 9/2007 | Liaw | .......................... | 257/369 |
| 7,365,432 B2 * | 4/2008 | Liaw | .......................... | 257/758 |
| 7,376,002 B2 * | 5/2008 | Nii | .............................. | 365/154 |
| 7,400,523 B2 * | 7/2008 | Houston | ..................... | 365/154 |
| 7,405,994 B2 * | 7/2008 | Liaw | ..................... | 365/230.05 |
| 7,440,356 B2 * | 10/2008 | Venkatraman et al. | . | 365/230.05 |
| 7,483,332 B2 * | 1/2009 | Houston | ................ | 365/230.05 |
| 7,489,539 B2 * | 2/2009 | Nii | .............................. | 365/154 |
| 2001/0043487 A1 * | 11/2001 | Nii et al. | ..................... | 365/154 |
| 2002/0117722 A1 * | 8/2002 | Osada et al. | ................ | 257/379 |
| 2004/0120209 A1 * | 6/2004 | Lee et al. | ............... | 365/230.05 |

(Continued)

FOREIGN PATENT DOCUMENTS

JP    2003-297953    10/2003

OTHER PUBLICATIONS

S.M. Sze and Kwok K. Ng, Physics of Semiconductor Devices Third Edition, Wiley-Interscience John Wiley & Sons, Inc., 2007, pp. 304-306.*

*Primary Examiner*—Kiesha L Rose
*Assistant Examiner*—Eric Ward
(74) *Attorney, Agent, or Firm*—McDermott Will & Emery LLP (57) ABSTRACT

A first semiconductor region has a smaller width along a gate length direction than a second semiconductor region. In this case, the first semiconductor region has a larger width along a gate width direction than the second semiconductor region.

20 Claims, 5 Drawing Sheets

U.S. PATENT DOCUMENTS

| | | | |
|---|---|---|---|
| 2005/0253287 A1* | 11/2005 | Liaw | 257/903 |
| 2006/0038234 A1* | 2/2006 | Liaw | 257/368 |
| 2006/0289945 A1* | 12/2006 | Nii | 257/393 |
| 2007/0138514 A1* | 6/2007 | Chang | 257/241 |
| 2008/0151653 A1* | 6/2008 | Ishikura et al. | 365/189.15 |
| 2008/0192561 A1* | 8/2008 | Huang et al. | 365/230.05 |
| 2008/0197419 A1* | 8/2008 | Liaw | 257/368 |
| 2008/0273382 A1* | 11/2008 | Wang | 365/181 |
| 2009/0091970 A1* | 4/2009 | Nii | 365/154 |

* cited by examiner

SEMICONDUCTOR DEVICE

BACKGROUND OF THE INVENTION

The present invention relates to a semiconductor device, and more particularly, it relates to a semiconductor device including a plurality of MIS transistors.

Recently, a static random access memory (SRAM) is used as a high-speed memory device. In particular, since it is necessary to simultaneously execute a read operation and a write operation in speech processing and image processing, an SRAM with a two-port structure (hereinafter referred to as a "two-port SRAM") is used (see, for example, Japanese Laid-Open Patent Publication No. 2003-297953).

Figure 7:
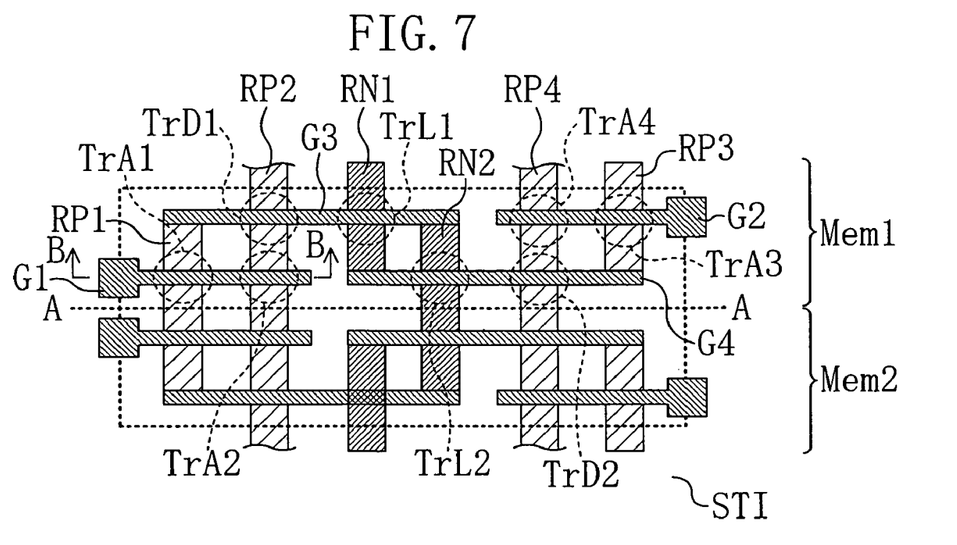
FIG. 7 is a schematic plan view of a conventional semiconductor device including a two-port SRAM.

Now, a conventional semiconductor device including a two-port SRAM will be described with reference to the accompanying drawing. FIG. 7 is a schematic plan view of the conventional semiconductor device including the two-port SRAM.

It is noted that semiconductor regions and gate electrodes are shown with contacts, lines and the like omitted in this drawing.

As shown in FIG. 7, the conventional two-port SRAM has a structure in which an SRAM cell Mem1 and an SRAM cell Mem2 each corresponding to one bit are adjacent to each other with a boundary of line A-A. Transistors of the SRAM cell Mem1 and the SRAM cell Mem2 are axisymmetrically disposed about line A-A.

The SRAM cell Mem1 includes four access transistors TrA1, TrA2, TrA3 and TfA4 of N-type MIS transistors, two driver transistors TrD1 and TrD2 of N-type MIS transistors and two load transistors TrL1 and TrL2 of P-type MIS transistors.

Next, the specific arrangement of the transistors in the SRAM cell Mem1 will be described. The SRAM cell Mem1 has semiconductor regions RP1, RP2, RP3, RP4, RN1 and RN2. The semiconductor regions RP1, RP2, RP3, RP4, RN1 and RN2 are surrounded by an isolation region STI to be separated from one another.

A first gate line G1 is formed on the first semiconductor region RP1. The first gate line G1 extends onto the second semiconductor region RP2. A portion of the first gate line G1 disposed on the first semiconductor region RP1 works as a gate electrode of the first access transistor TrA1 and a portion thereof disposed on the second semiconductor region RP2 works as a gate electrode of the second access transistor TrA2.

A second gate line G2 is formed on the third semiconductor region RP3. The second gate line G2 extends onto the fourth semiconductor region RP4. A portion of the second gate line G2 disposed on the third semiconductor region RP3 works as a gate electrode of the third access transistor TrA3 and a portion thereof disposed on the fourth semiconductor region RP4 works as a gate electrode of the fourth access transistor TrA4.

A third gate line G3 is formed on the second semiconductor region RP2. A portion of the third gate line G3 disposed on the second semiconductor region RP2 works as a gate electrode of the first driver transistor TrD1. On the other hand, a fourth gate line G4 is formed on the fourth semiconductor region RP4. A portion of the fourth gate line G4 disposed on the fourth semiconductor region RP4 works as a gate electrode of the second driver transistor TrD2.

The third gate line G3 extends onto the fifth semiconductor region RN1. A portion of the third gate line G3 disposed on the fifth semiconductor region RN1 works as a gate electrode of the first load transistor TrL1. On the other hand, the fourth gate line G4 extends onto the sixth semiconductor region RN2. A portion of the fourth gate line G4 disposed on the sixth semiconductor region RN2 works as a gate electrode of the second load transistor TrL2.

In the two-port SRAM, the first access transistor TrA1 and the second access transistor TrA2 should have the same transistor characteristics.

In accordance with refinement of semiconductor devices, however, it is difficult to form the first access transistor TrA1 and the second access transistor TrA2 with the same transistor characteristics, and there arises a problem that a difference in the transistor characteristics is large.

A write margin of an SRAM has positive correlation with a ratio in the saturation current value of a load transistor to an access transistor. Therefore, for example, in the case where the saturation current value of the first access transistor TrA1 is smaller than the saturation current value of the second access transistor TrA2, there arises a problem that a write margin obtained in using the first access transistor TrA1 is smaller than that obtained in using the second access transistor TrA2.

Such a problem occurs not only in an SRAM but also in any semiconductor device including a plurality of transistors whose characteristics should be equivalent.

SUMMARY OF THE INVENTION

The present invention was devised in consideration of the aforementioned problems, and an object of the invention is providing a semiconductor device in which characteristics of a plurality of transistors can be made close and a fabrication method for the same.

The first semiconductor device of this invention includes a first MIS transistor and a second MIS transistor, the first MIS transistor includes a first source/drain region formed in a first semiconductor region surrounded by an isolation region in a semiconductor substrate; and a first gate electrode formed on the first semiconductor region and having a first gate length and a first gate width, the second MIS transistor includes a second source/drain region formed in a second semiconductor region surrounded by the isolation region in the semiconductor substrate; and a second gate electrode formed on the second semiconductor region and having a second gate length and a second gate width, the first gate electrode and the second gate electrode are made of a single film, the first gate width is larger than the second gate width, and the first semiconductor region has a smaller width along a gate length direction than the second semiconductor region.

In the first semiconductor device of this invention, the gate width of the first MIS transistor formed in the first semiconductor region having a smaller width along the gate length direction than the second semiconductor region where the second MIS transistor is formed is set to be relatively large, so that lowering of the saturation current of the first MIS transistor caused by stress applied by the isolation region can be complemented. Thus, a characteristic difference between the first MIS transistor and the second MIS transistor can be reduced.

In the first semiconductor device of the invention, the first gate length and the second gate length may be substantially equivalent.

In the first semiconductor device of the invention, the first gate length may be shorter than the second gate length.

In the first semiconductor device of the invention, the first MIS transistor may further include a first channel region formed below the first gate electrode in the first semiconductor region, the second MIS transistor may further include a second channel region formed below the second gate electrode in the second semiconductor region, and an impurity concentration may be lower in the first channel region than in the second channel region. In this case, the saturation current value of the first MIS transistor can be further improved.

The second semiconductor device of the invention includes a first MIS transistor and a second MIS transistor, the first MIS transistor includes a first source/drain region formed in a first semiconductor region surrounded by an isolation region in a semiconductor substrate; and a first gate electrode formed on the first semiconductor region and having a first gate length and a first gate width, the second MIS transistor includes a second source/drain region formed in a second semiconductor region surrounded by the isolation region in the semiconductor substrate; and a second gate electrode formed on the second semiconductor region and having a second gate length and a second gate width, the first gate electrode and the second gate electrode are made of a single film, the first gate length is shorter than the second gate length, and the first semiconductor region has a smaller width along a gate length direction than the second semiconductor region.

In the second semiconductor device of this invention, the gate length of the first MIS transistor formed in the first semiconductor region having a smaller width along the gate length direction than the second semiconductor region where the second MIS transistor is formed is set to be relatively short, so that the lowering of the saturation current of the first MIS transistor caused by the stress applied by the isolation region can be complemented. Thus, a characteristic difference between the first MIS transistor and the second MIS transistor can be reduced.

In the second semiconductor device of the invention, the first gate width and the second gate width may be substantially equivalent.

In the second semiconductor device of the invention, a distance from the first gate electrode to an end of the first semiconductor region may be shorter than a distance from an end of the second gate electrode to an end of the second semiconductor region.

In the second semiconductor device of the invention, the first MIS transistor may further include a first channel region formed below the first gate electrode in the first semiconductor region, the second MIS transistor may further include a second channel region formed below the second gate electrode in the second semiconductor region, and an impurity concentration may be lower in the first channel region than in the second channel region.

The third semiconductor device of the invention includes a first MIS transistor and a second MIS transistor, the first MIS transistor includes a first source/drain region formed in a first semiconductor region surrounded by an isolation region in a semiconductor substrate; a first gate electrode formed on the first semiconductor region and having a first gate length and a first gate width; and a first channel region formed below the first gate electrode in the first semiconductor region, the second MIS transistor includes a second source/drain region formed in a second semiconductor region surrounded by the isolation region in the semiconductor substrate; a second gate electrode formed on the second semiconductor region and having a second gate length and a second gate width; and a second channel region formed below the second gate electrode in the second semiconductor region, the first gate electrode and the second gate electrode are made of a single film, the first semiconductor region has a smaller width along a gate length direction than the second semiconductor region, and an impurity concentration is lower in the first channel region than in the second channel region.

In the third semiconductor device of this invention, the impurity concentration of the channel region of the first MIS transistor formed in the first semiconductor region having a smaller width along the gate length direction than the second semiconductor region where the second MIS transistor is formed is set to be relatively low, so that increase of the threshold voltage of the first MIS transistor caused by the stress applied by the isolation region can be complemented. Thus, a characteristic difference between the first MIS transistor and the second MIS transistor can be reduced.

In the third semiconductor device of the invention, the first gate width and the second gate width may be substantially equivalent, and the first gate length and the second gate length may be substantially equivalent.

In each of the first through third semiconductor devices of the invention, a distance from the first gate electrode to an end of the first semiconductor region (a minimum distance) may be shorter than a distance from the second gate electrode to an end of the second semiconductor region (a minimum distance).

In each of the first through third semiconductor devices of the invention, the first MIS transistor and the second MIS transistor may be designed to have an equivalent saturation current value.

In each of the first through third semiconductor devices of the invention, the first MIS transistor and the second MIS transistor may be N-type MIS transistors.

In each of the first through third semiconductor devices of the invention, the first MIS transistor and the second MIS transistor may be included in an SRAM.

In each of the first through third semiconductor devices of the invention, the first MIS transistor and the second MIS transistor may be access transistors.

DETAILED DESCRIPTION OF THE INVENTION (Examination Results)

Now, examination results for the reason why variation is caused in the characteristics between a first access transistor TrA1 and a second access transistor TrA2 in a two-port SRAM will be described. FIG. 7 for showing the configuration of the conventional two-port SRAM is referred to again in the following description:

As shown in FIG. 7, the first semiconductor region RP1 is shared by the first access transistors TrA1 of the SRAM cells Mem1 and Mem2.

On the other hand, the second semiconductor region RP2 is shared by the second access transistors TrA2 and the first driver transistors TrD1 of the SRAM cells Mem1 and Mem2. Therefore, the length along the gate length direction of the second semiconductor region RP2 is larger than the length along the gate length direction of the first semiconductor region RP1. Furthermore, in the case where other cells are disposed to be adjacent on both sides (i.e., on the upper and lower sides in FIG. 7) of the SRAM cells Mem1 and Mem2, the second semiconductor region RP2 extends into these adjacent cells. In this case, a difference in the length along the gate length direction between the second semiconductor region RP2 and the first semiconductor region RP1 becomes larger.

Figure 8:
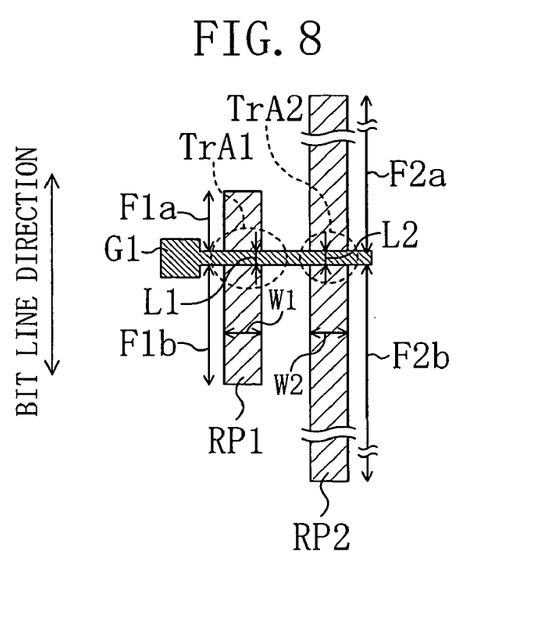
FIG. 8 is a schematic plan view of gate electrodes and semiconductor regions of a first access transistor TrA1 and a second access transistor TrA2 extracted from FIG. 7.

FIG. 8 is a schematic plan view of the gate electrodes and the semiconductor regions of the first access transistor TrA1 and the second access transistor TrA2 extracted from FIG. 7.

As shown in FIG. 8, distances F1a and F1b from the gate line G1 to the ends along the gate length direction of the first semiconductor region RP1 are, for example, 220 nm and 500 nm.

On the other hand, distances F2a and F2b from the gate line G1 to the ends along the gate length direction of the second semiconductor region RP2 are as large as 30 μm or more.

The gate length L1 of the gate electrode (i.e., the gate line G1) of the first access transistor TrA1 and the gate length L2 of the gate electrode (i.e., the gate line G1) of the second access transistor TrA2 are the same.

Also, the width along the gate width direction of the first semiconductor region RP1 and the width along the gate width direction of the second semiconductor region RP2 are the same. Accordingly, the gate width W1 of the gate electrode (i.e., the gate line G1) of the first access transistor TrA1 and the gate width W2 of the gate electrode (i.e., the gate line G1) of the second access transistor TrA2 are the same.

The transistor characteristics are varied by stress applied by an isolation region to a semiconductor region. Specifically, when the length along the gate length direction is different between the first semiconductor region RP1 and the second semiconductor region RP2, stress applied to the first access transistor TrA1 and stress applied to the second access transistor TrA2 are different, and hence, the transistor characteristics of these transistors are different.

More specifically, since the distances F1a and F1b are shorter than the distances F2a and F2b, the stress applied by the isolation region to a channel region is larger in the first access transistor TrA1 than in the second access transistor TrA2. Therefore, for example, the threshold voltage is higher by approximately 50 mV and the saturation current value is smaller by approximately 10% in the first access transistor TrA1 than in the second access transistor TrA2.

On the basis of these examinations, a method for adjusting the characteristic variation among a plurality of transistors different in a distance from an end of a gate electrode to an end of a semiconductor region is devised.

EMBODIMENT 1

A semiconductor device according to Embodiment 1 of the invention will now be described with reference to the accompanying drawings.

Figure 1:
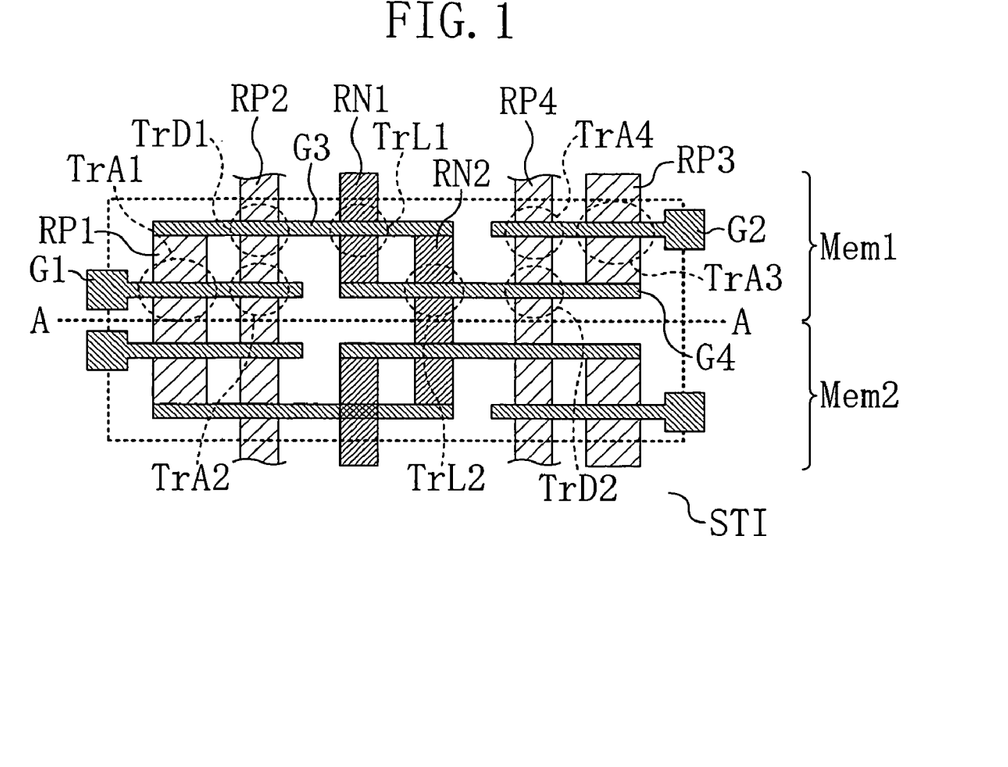
FIG. 1 is a schematic plan view of a semiconductor device including a two-port SRAM according to Embodiment 1 of the invention.

FIG. 1 is a schematic plan view of the semiconductor device including a two-port SRAM according to this embodiment, wherein semiconductor regions and gate electrodes are shown with contacts, lines and the like omitted.

As shown in FIG. 1, the two-port SRAM of this embodiment has a structure in which an SRAM cell Mem1 and an SRAM cell Mem2 each corresponding to one bit are adjacent to each other with a boundary of line A-A. Transistors of the SRAM cell Mem1 and the SRAM cell Mem2 are axisymmetrically disposed about line A-A.

The SRAM cell Mem1 includes four access transistors TrA1, TrA2, TrA3 and TrA4 of N-type MIS transistors, two driver transistors TrD1 and TrD2 of N-type MIS transistors and two load transistors TrL1 and TrL2 of P-type MIS transistors.

The specific arrangement of transistors in the SRAM cell Mem1 will now be described. The SRAM cell Mem1 has p-type semiconductor regions RP1, RP2, RP3 and RP4 and n-type semiconductor regions RN1 and RN2. The respective semiconductor regions RP1, RP2, RP3, RP4, RN1 and RN2 are surrounded by an isolation region STI to be separated from one another.

A first gate line G1 is formed on the first semiconductor region RP1. The first gate line G1 extends onto the second semiconductor region RP2. A portion of the first gate line G1 disposed on the first semiconductor region RP1 works as a gate electrode of the first access transistor TrA1, and a portion thereof disposed on the second semiconductor region RP2 works as a gate electrode of the second access transistor TrA2. Although no reference numeral is provided, n-type source/drain regions corresponding to active regions are formed in portions of the first semiconductor region RP1 and the second semiconductor region RP2 disposed on both sides of the first gate line G1.

A second gate line G2 is formed on the third semiconductor region RP3. The second gate line G2 extends onto the fourth semiconductor region RP4. A portion of the second gate line G2 disposed on the third semiconductor region RP3 works as a gate electrode of the third access transistor TrA3, and a portion thereof disposed on the fourth semiconductor region RP4 works as a gate electrode of the fourth access transistor TrA4. Although no reference numeral is provided, n-type source/drain regions corresponding to active regions are formed in portions of the third semiconductor region RP3 and the fourth semiconductor region RP4 disposed on both sides of the second gate line G2. Specifically, the n-type source/drain regions are formed in the semiconductor regions RP1 through RP4, and a p-type impurity is present in a channel region formed between the source and the drain.

At this point, each of the first access transistor TrA1 and the third access transistor TrA3 has a gate length of 60 nm and a gate width (i.e., the length along the gate width direction of the semiconductor regions RP1 and RP3) of 200 nm. Also, each of the second access transistor TrA2 and the fourth access transistor TrA4 has a gate length of 60 nm and a gate width (i.e., the length along the gate width direction of the semiconductor regions RP2 and RP4) of 180 nm.

A third gate line G3 is formed on the second semiconductor region RP2. A portion of the third gate line G3 disposed on the second semiconductor region RP2 works as a gate electrode of the first driver transistor TrD1. On the other hand, a fourth gate line G4 is formed on the fourth semiconductor region RP4. A portion of the fourth gate line G4 disposed on the fourth semiconductor region RP4 works as a gate electrode of the second driver transistor TrD2. Although no reference numeral is provided, n-type source/drain regions corresponding to active regions are formed in portions of the second semiconductor region RP2 disposed on both sides of the third gate line G3, and n-type source/drain regions corresponding to active regions are also formed in portions of the fourth semiconductor region RP4 disposed on both sides of the gate line G4. Each of the first driver transistor TrD1 and the second driver transistor TrD2 has a gate length of 60 nm and a gate width (i.e., the length along the gate width direction of the semiconductor regions RP2 and RP4) of 180 nm.

The third gate line G3 extends onto the fifth semiconductor region RN1. A portion of the third gate line G3 disposed on the fifth semiconductor region RN1 works as a gate electrode of the first load transistor TrL1. On the other hand, the fourth gate line G4 extends onto the sixth semiconductor region RN2. A portion of the fourth gate line G4 disposed on the sixth semiconductor region RN2 works as a gate electrode of the second load transistor TrL2. Although no reference numeral is provided, p-type source/drain regions corresponding to active regions are formed in portion of the fifth semiconductor region RN1 disposed on both sides of the third gate line G3 and in portions of the sixth semiconductor region RN2 disposed on both sides of the fourth gate line G4. In other words, the p-type source/drain regions are formed in the semiconductor regions RN1 and RN2, and an n-type impurity is present in a channel region formed between the source and the drain. Also, each of the first load transistor TrL1 and the second load transistor TrL2 has a gate length of 60 nm and a gate width (i.e., the length along the gate width direction of the semiconductor regions RN1 and RN2) of 120 nm.

In the semiconductor device of this embodiment, each of the first semiconductor region RP1 and the third semiconductor region RP3 has a width along the gate width direction of 200 nm, each of the second semiconductor region RP2 and the fourth semiconductor region RP4 has a width along the gate width direction of 180 nm, and each of the fifth semiconductor region RN1 and the sixth semiconductor region RN2 has a width along the gate width direction of 120 nm. In other words, the isolation region STI is formed so as to secure these widths.

As shown in FIG. 1, the first semiconductor region RP1 is shared by the first access transistors TrA1 of the SRAM cells Mem1 and Mem2.

On the other hand, the second semiconductor region RP2 is shared by the second access transistors TrA2 and the first driver transistors TrD1 of the SRAM cells Mem1 and Mem2. Therefore, the length along the gate length direction of the second semiconductor region RP2 is larger than the length along the gate length direction of the first semiconductor region RP1. Furthermore, in the case where other cells are disposed to be adjacent on both sides (i.e., the upper and lower sides in FIG. 1) of the SRAM cells Mem1 and Mem2, the second semiconductor region extends into these adjacent cells. In this case, a difference in the length along the gate length direction between the second semiconductor region RP2 and the first semiconductor region RP1 is larger.

Figure 2:
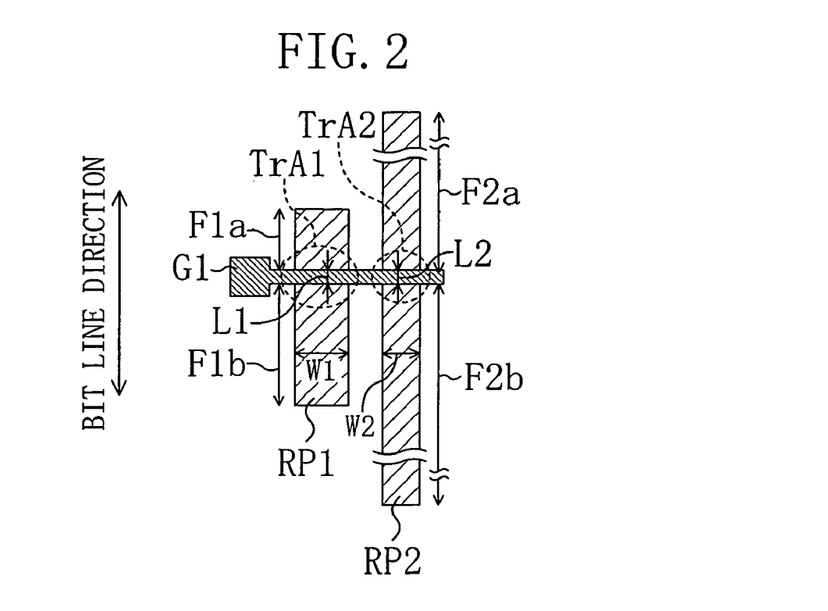
FIG. 2 is a schematic plan view of gate electrodes and semiconductor regions of a first access transistor TrA1 and a second access transistor TrA2 extracted from FIG. 1.

FIG. 2 is a schematic plan view of the gate electrodes and the semiconductor regions of the first access transistor TrA1 and the second access transistor TrA2 extracted from FIG. 1.

As shown in FIG. 2, distances F1a and F1b from the ends of the gate line G1 to the ends along the gate length direction of the first semiconductor region RP1 are, for example, 200 nm and 500 nm.

On the other hand, distances F2a and F2b from the ends of the gate line G1 to the ends along the gate length direction of the second semiconductor region RP2 are as large as 30 μm or more.

The gate length L1 of the gate electrode (i.e., the gate line G1) of the first access transistor TrA1 and the gate length L2 of the gate electrode (i.e., the gate line G1) of the second access transistor TrA2 are the same.

In this embodiment, the width along the gate width direction of the first semiconductor region RP1 is set to 200 nm and the width along the gate width direction of the second semiconductor region RP2 is set to 180 nm, so that the gate width W1 of the first access transistor TrA1 can be larger than the gate width W2 of the second access transistor TrA2 by approximately 10%.

According to this embodiment, the saturation current value of the first access transistor TrA1 and the saturation current value of the second access transistor TrA2 can be made substantially equivalent. Specifically, in the conventional configuration shown in FIG. 8, the first access transistor TrA1 and the second access transistor TrA2 have the same gate length and the same gate width. In this case, the saturation current value of the first access transistor TrA1 is lower than the saturation current value of the second access transistor TrA2 by approximately 10% owing to the stress applied by the isolation region. On the contrary, in this embodiment, the gate width W1 of the first access transistor TrA1 is larger than the gate width W2 of the second access transistor TrA2 by approximately 10%, and therefore, the lowering of the saturation current value caused by the stress applied by the isolation region can be complemented, so as to make the saturation current values of the two transistors substantially equivalent. As a result, a characteristic difference between the two transistors can be reduced.

In this embodiment, in the case where the saturation current value of the first access transistor TrA1 is lower than the saturation current value of the second access transistor TrA2 by approximately 10%, the gate widths of these two transistors are differed by approximately 10%. The difference in the saturation current between two transistors depends, however, upon the widths of semiconductor regions (i.e., the distances F1a, F1b, F2a and F2b of FIG. 2). Therefore, the gate widths of the transistors are made to differ in accordance with a ratio of the difference in the saturation current. Specifically, in the case where the saturation current value of the first access transistor TrA1 is lower than the saturation current value of the second access transistor TrA2 by 20% at most, the gate width of the first access transistor TrA1 is made to be smaller than the gate width of the second access transistor TrA2 by 20%.

Although the description is made on the first and second access transistors TrA1 and TrA2 in this embodiment, with respect to the third and fourth access transistors TrA3 and TrA4, the saturation current values can be made substantially equivalent in a similar manner by setting the gate width of the third access transistor TrA3 to be larger than the gate width of the fourth access transistor TrA4 by approximately 10%.

EMBODIMENT 2

A semiconductor device according to Embodiment 2 of the invention will now be described with reference to the accompanying drawings.

Figure 3:
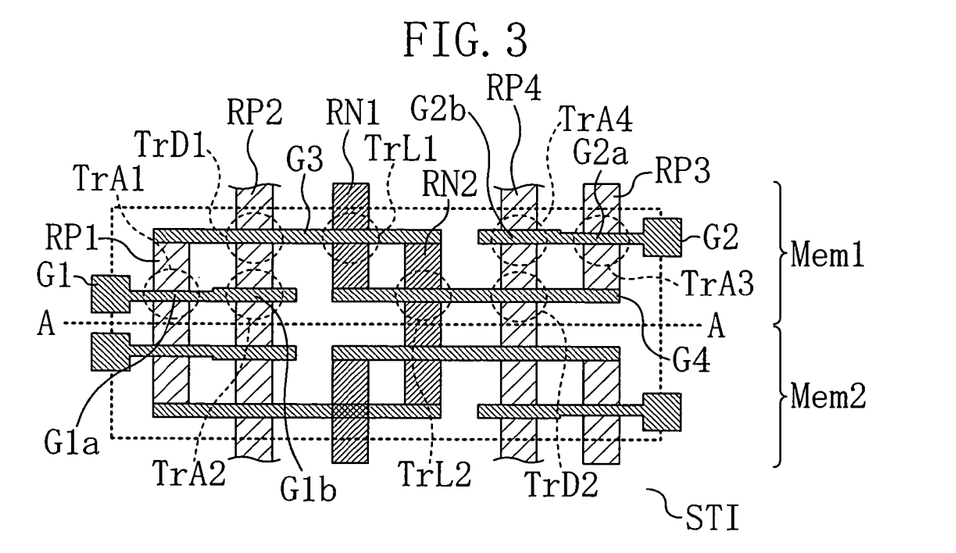
FIG. 3 is a schematic plan view of a semiconductor device including a two-port SRAM according to Embodiment 2 of the invention.

FIG. 3 is a schematic plan view of the semiconductor device including a two-port SRAM of this embodiment, wherein semiconductor regions and gate electrodes are shown with contacts, lines and the like omitted.

As shown in FIG. 3, gate lines and semiconductor regions are arranged in the two-port SRAM of this embodiment in the same manner as in Embodiment 1. Description of portions of the semiconductor device of this embodiment similar to those of Embodiment 1 is omitted.

Although the gate widths are different between the first access transistor TrA1 and the second access transistor TrA2 in Embodiment 1, the gate lengths are different in this embodiment. This will now be specifically described.

In the semiconductor device of this embodiment, a portion of the first gate line G1 disposed on the first semiconductor region RP1 works as a gate electrode G1a of the first access transistor TrA1, and a portion thereof disposed on the second semiconductor region RP2 works as a gate electrode G1b of the second access transistor TrA2.

Also, a portion of the second gate line G2 disposed on the third semiconductor region RP3 works as a gate electrode G2a of the third access transistor TrA3, and a portion thereof disposed on the fourth semiconductor region RP4 works as a gate electrode G2b of the fourth access transistor TrA4.

In this embodiment, the gate length of the gate electrode G1a of the first access transistor TrA1 is shorter than the gate length of the gate electrode G1b of the second access transistor TrA2. Also, the gate length of the gate electrode G2a of the third access transistor TrA3 is shorter than the gate length of the gate electrode G2b of the fourth access transistor TrA4. On the other hand, the gate widths of the access transistors TrA1 through TrA4 are set to a uniform value.

Figure 4:
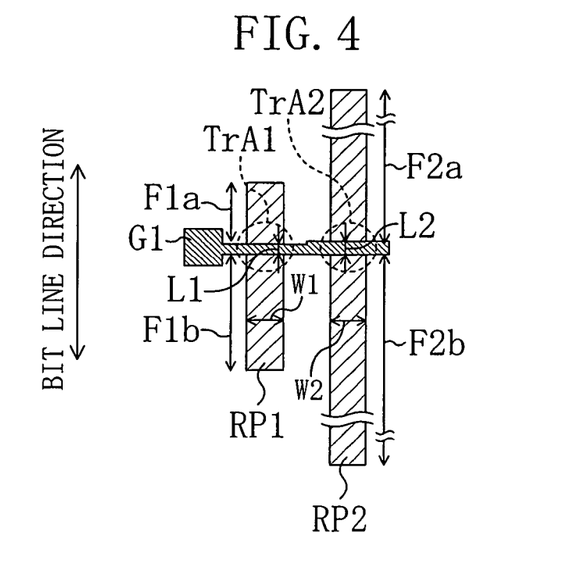
FIG. 4 is a schematic plan view of gate electrodes and semiconductor regions of a first access transistor TrA1 and a second access transistor TrA2 extracted from FIG. 3.

FIG. 4 is a schematic plan view of the gate electrodes and the semiconductor regions of the first access transistor TrA1 and the second access transistor TrA2 extracted from FIG. 3.

As shown in FIG. 4, distances F1a and F1b from the ends of the gate line G1 disposed on the first semiconductor region RP1 to the ends along the gate length direction of the first semiconductor region RP1 are, for example, 220 nm and 500 nm.

On the other hand, distances F2a and F2b from the ends of the gate line G1 disposed on the second semiconductor region RP2 to the ends along the gate length direction of the second semiconductor region RP2 are as large as 30 μm or more.

The gate width W1 of the gate electrode G1a of the first access transistor TrA1 and the gate width W2 of the gate electrode G1b of the second access transistor TrA2 are the same.

In this embodiment, the gate length L1 of the gate electrode G1a of the first access transistor TrA1 is shorter than the gate length L2 of the gate electrode G1b of the second access transistor TrA2 by approximately 10%. Specifically, the first gate line G1 is formed so that the gate length L1 of its portion corresponding to the gate electrode G1a can be 54 nm and that the gate length L2 of its portion corresponding to the gate electrode G1b can be 60 nm.

According to this embodiment, the saturation current value of the first access transistor TrA1 and the saturation current value of the second access transistor TrA2 can be substantially equivalent. Specifically, in the conventional configuration shown in FIG. 8, the first access transistor TrA1 and the second access transistor TrA2 have the same gate length and the same gate width. In this case, the saturation current value of the first access transistor TrA1 is lower than the saturation current value of the second access transistor TrA2 by approximately 10% owing to the stress applied by the isolation region. On the contrary, since the gate length L1 of the first access transistor TrA1 is shorter than the gate length L2 of the second access transistor TrA2 by approximately 10% in this embodiment, the lowering of the saturation current value caused by the stress applied by the isolation region can be complemented, so as to make the saturation current values of the two transistors substantially equivalent. As a result, the characteristic difference between the two transistors can be reduced.

In this embodiment, in the case where the saturation current value of the first access transistor TrA1 is lower than the saturation current value of the second access transistor TrA2 by approximately 10%, the gate lengths of these two transistors are differed by approximately 10%. The difference in the saturation current between two transistors depends, however, upon the widths of semiconductor regions (i.e., the distances F1a, F1b, F2a and F2b of FIG. 4). Therefore, the gate lengths of the transistors are made to differ in accordance with a ratio of the difference in the saturation current. Specifically, the saturation current value of the first access transistor TrA1 is lower than the saturation current value of the second access transistor TrA2 by 20% at most. In this case, the gate length of the first access transistor TrA1 is made to be shorter than the gate length of the second access transistor TrA2 by 20%.

Although the description is made on the first and second access transistors TrA1 and TrA2 in this embodiment, with respect to the third and fourth access transistors TrA3 and TrA4, the saturation current values can be made substantially equivalent in a similar manner by setting the gate length of the third access transistor TrA3 to be shorter than the gate length of the fourth access transistor TrA4 by approximately 10%.

EMBODIMENT 3

A semiconductor device according to Embodiment 3 of the invention will now be described with reference to the accompanying drawings.

Figure 5A:
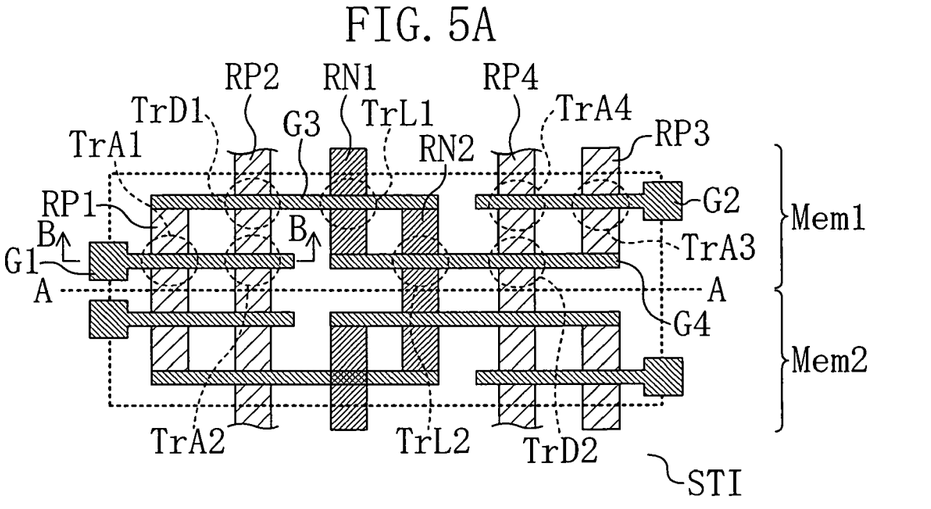
FIG. 5A is a schematic plan view of a semiconductor device including a two-port SRAM according to Embodiment 3 of the invention and FIG. 5B is a cross-sectional view thereof taken on line B-B of FIG. 5A.

FIG. 5A is a schematic plan view of the semiconductor device including a two-port SRAM of this embodiment, wherein semiconductor regions and gate electrodes are shown with contacts, lines and the like omitted.

As shown in FIG. 5A, the arrangement itself of gate lines and semiconductor regions in the two-port SRAM of this embodiment is the same as that of Embodiment 1. Description of portions of the semiconductor device of this embodiment similar to those of Embodiment 1 is omitted.

While the gate width is different between the first access transistor TrA1 and the second access transistor TrA2 in Embodiment 1, the concentration of an impurity introduced into a channel region is different in this embodiment. This will now be specifically described.

Figure 5B:
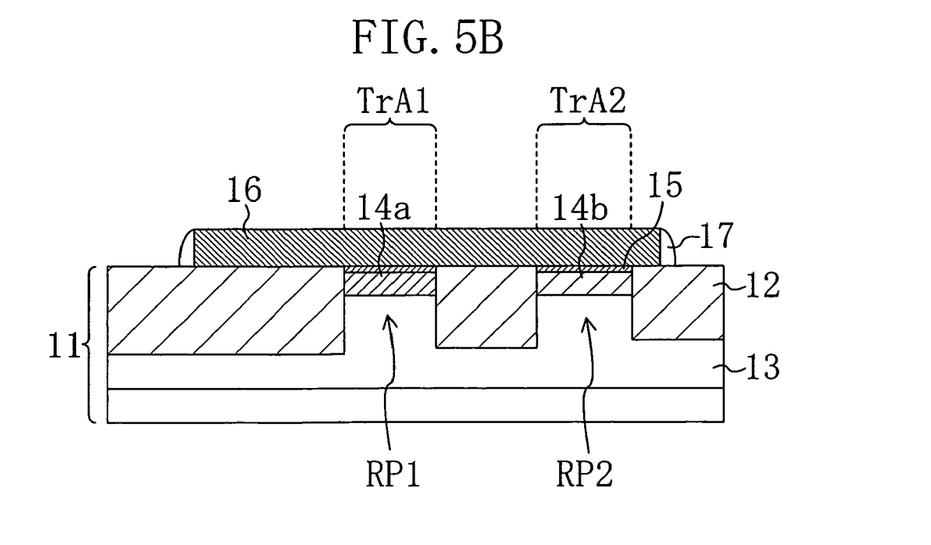

FIG. 5B is a cross-sectional view taken on line B-B of FIG. 5A. As shown in FIG. 5B, a first semiconductor region RP1 and a second semiconductor region RP2 is partitioned by an isolation region 12 in a semiconductor substrate 11. A p-well 13 is formed in an upper portion of the semiconductor substrate 11. A gate insulating film 15 is formed on the first semiconductor region RP1 and the second semiconductor region RP2 in the semiconductor substrate 11. A gate line 16 is formed on the gate insulating film 15 on the first semiconductor region RP1 and the second semiconductor region RP2 and portions of the isolation region 12 disposed around these semiconductor regions. A sidewall 17 is formed on the side face of the gate line 16.

A channel region 14a is formed in the first semiconductor region RP1 in the semiconductor substrate 11. The channel region 14a is doped with a p-type impurity of a concentration of $1.9 \times 10^{18}$ cm$^{-3}$. On the other hand, a channel region 14b is formed in the second semiconductor region RP2 in the semiconductor substrate 11. The channel region 14b is doped with a p-type impurity of a concentration of $2.0 \times 10^{18}$ cm$^{-3}$. In other words, the impurity concentration (peak concentration)

is lower in the channel region 14a than in the channel region 14b by 5% in this embodiment.

In the semiconductor device of this embodiment, the threshold voltage of the first access transistor TrA1 and the threshold voltage of the second access transistor TrA2 can be substantially equivalent. Specifically, in the conventional configuration shown in FIG. 8, the first access transistor TrA1 and the second access transistor TrA2 have the same gate length and the same gate width. In this case, the threshold voltage of the first access transistor TrA1 is higher than that of the second access transistor TrA2 by approximately 50 mV owing to the stress applied by the isolation region. On the contrary, since the impurity concentration in the channel region 14a of the first access transistor TrA1 is lower than the impurity concentration in the channel region 14b of the second access transistor TrA2 by 5% in this embodiment, the increase of the threshold voltage caused by the stress applied by the isolation region can be suppressed, so as to make the threshold voltage of the two transistors substantially equivalent. As a result, the characteristic difference between the two transistors can be reduced.

In this embodiment, in the case where the threshold voltage of the first access transistor TrA1 is higher than the threshold voltage of the second access transistor TrA2 by approximately 50 mV, the impurity concentrations in the channel regions of these two transistors are differed by 5%. The difference in the threshold voltage between two transistors depends, however, upon the widths of semiconductor regions (i.e., the distances F1a, F1b, F2a and F2b of FIG. 4). Therefore, the impurity concentrations in the transistors are made to differ in accordance with a ratio of the difference in the threshold voltage. Specifically, the threshold voltage of the first access transistor TrA1 is higher than the threshold voltage of the second access transistor TrA2 by 100 mV at most. In this case, the impurity concentration in the channel region of the first access transistor TrA1 is made to be lower than the impurity concentration in the channel region of the second access transistor TrA2 by 10%.

Next, a fabrication method for the semiconductor device of this embodiment will be described with reference to the accompanying drawings. FIGS. 6A through 6D are cross-sectional views for showing procedures in the fabrication method for the semiconductor device according to Embodiment 3 of the invention. In the fabrication method of this embodiment, a p-well 13 is first formed by implanting boron, that is, a p-type impurity, into an upper portion of a semiconductor substrate 11 at implantation energy of 250 keV and a dose of $1.0 \times 10^{13}$ ions/cm$^2$ in the procedure shown in FIG. 6A. Thereafter, an isolation region 12 with an STI structure is formed by forming a trench in the semiconductor substrate and filling the trench with an insulating film. This isolation region 12 separates a first semiconductor region RP1 and a second semiconductor region RP2 from each other in the semiconductor substrate 11.

Figure 6A:
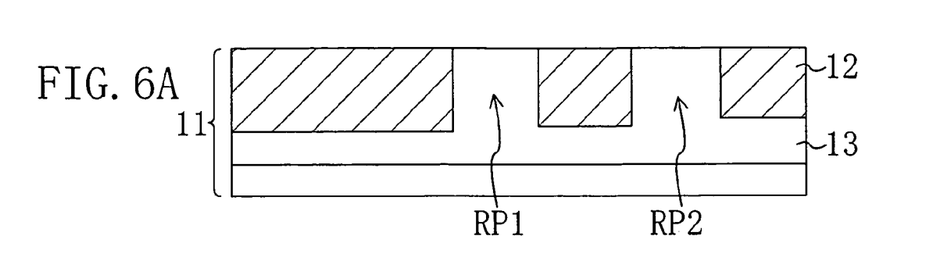
FIGS. 6A, 6B, 6C and 6D are cross-sectional views for showing procedures in fabrication of the semiconductor device of Embodiment 3.
Figure 6B:
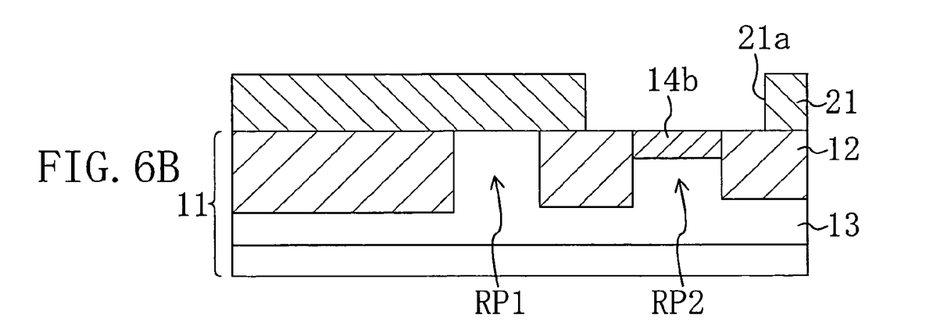

Next, in the procedure shown in FIG. 6B, a resist 21 is formed on the semiconductor substrate 11, and an opening 21a for exposing the second semiconductor region RP2 therein is formed in the resist 21. Then, boron is ion implanted at implantation energy of 10 keV and a dose of $4.0 \times 10^{12}$ ions/cm$^2$ with the resist 21 used as a mask, thereby forming a channel region 14b in the second semiconductor region RP2.

Figure 6C:
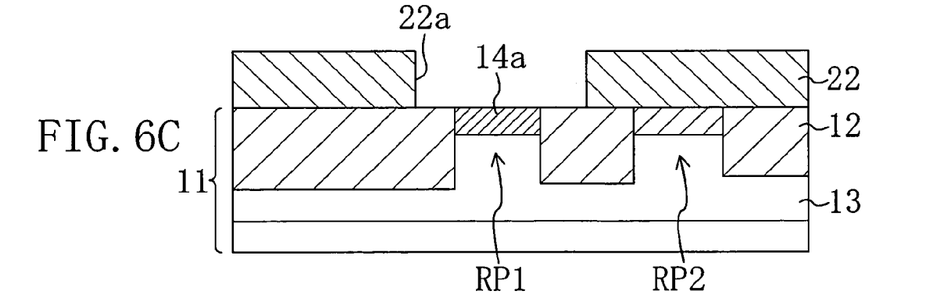

Subsequently, in the procedure shown in FIG. 6C, a resist 22 is formed on the semiconductor substrate 11, and an opening 22a for exposing the first semiconductor region RP1 therein is formed in the resist 22. Then, boron is ion implanted at implantation energy of 10 keV and a dose of $3.8 \times 10^{12}$ ions/cm$^{-2}$ with the resist mask 22 used as a mask, thereby forming a channel region 14a in the first semiconductor region RP1.

Figure 6D:
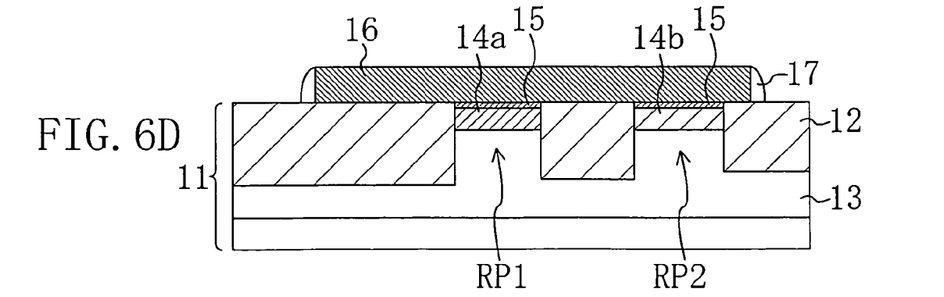

Next, in the procedure shown in FIG. 6D, a gate insulating film 15 made of a silicon oxide film or the like is formed on the first semiconductor region RP1 and the second semiconductor region RP2 on the semiconductor substrate 11. Thereafter, a gate line 16 made of polysilicon or the like is formed on the gate insulating film 15 and portions of the isolation region 12 disposed around the gate insulating film 15. Furthermore, a sidewall 17 made of a silicon nitride film or the like is formed on the side face of the gate line 16. In this manner, the semiconductor device of this embodiment can be fabricated.

In the fabrication method of this embodiment, since the dose of the channel region 14a of the first access transistor TrA1 is lower than the dose of the channel region 14b of the second access transistor TrA2 by approximately 5%, the increase of the threshold voltage caused by the stress applied by the isolation region can be suppressed, so as to make the threshold voltage of these two transistors substantially equivalent. As a result, the characteristic difference between the two transistors can be reduced.

In the fabrication method of this embodiment, in the case where the threshold voltage of the first access transistor TrA1 is higher than the threshold voltage of the second access transistor TrA2 by approximately 50 mV, the doses of the channel regions of these two transistors are differed by approximately 5%. The difference in the threshold voltage between two transistors depends, however, upon the widths of semiconductor regions. Therefore, the doses of the channel regions are made to differ in accordance with a difference in the threshold voltage. Specifically, the threshold voltage of the first access transistor TrA1 is higher than the threshold voltage of the second access transistor TrA2 by approximately 100 mV at most. In this case, the dose of the channel region of the first access transistor TrA1 is made to be lower than the dose of the channel region of the second access transistor TrA2 by 10%.

ALTERNATIVE EMBODIMENTS

In the above-described embodiments, the gate width, the gate length and the impurity concentration in the channel region are individually described. In the present invention, however, these embodiments may be combined. Specifically, a first access transistor TrA1 may be formed so as to have a larger gate width and a shorter gate length than a second access transistor TrA2. In this case, the impurity concentration in the channel region of the first access transistor TrA1 may be lower than that in the second access transistor TrA2. Alternatively, a first access transistor TrA1 may be formed so as to have a larger gate width and a lower impurity concentration in its channel region than a second access transistor TrA2. Alternatively, a first access transistor TrA1 may be formed so as to have a shorter gate length and a lower impurity concentration in its channel region than a second access transistor TrA2.

Furthermore, access transistors used in an SRAM are described as an example in the aforementioned embodiments. The present invention is, however, applicable to any two or more transistors respectively formed in semiconductor regions having different lengths along the gate width direction.

What is claimed is:

1. A semiconductor device comprising:
a first MIS transistor and a second MIS transistor,
wherein said first MIS transistor includes:
  a first source/drain region formed in a first semiconductor region surrounded by an isolation region in a semiconductor substrate; and
  a first gate electrode formed on said first semiconductor region and having a first gate length and a first gate width,
said second MIS transistor includes:
  a second source/drain region formed in a second semiconductor region surrounded by said isolation region in said semiconductor substrate; and
  a second gate electrode formed on said second semiconductor region and having a second gate length and a second gate width,
said first gate electrode and said second gate electrode are formed integrally extending in a gate width direction, and connected with each other, thereby constituting a single gate line,
said first gate width is larger than said second gate width,
said first semiconductor region and said second semiconductor region are separated from each other by said isolation region, and sandwich said isolation region in the gate width direction, and
said first semiconductor region has a smaller width along a gate length direction than said second semiconductor region, wherein said first MIS transistor and said second MIS transistor are included in an SRAM, and wherein said first MIS transistor and said second MIS transistor are access transistors.

2. The semiconductor device of claim 1, wherein said first gate length and said second gate length are substantially equivalent.

3. The semiconductor device of claim 1, wherein said first gate length is shorter than said second gate length.

4. The semiconductor device of claim 1, wherein said first MIS transistor further includes a first channel region formed below said first gate electrode in said first semiconductor region,
  said second MIS transistor further includes a second channel region formed below said second gate electrode in said second semiconductor region, and
  an impurity concentration is lower in said first channel region than in said second channel region.

5. The semiconductor device of claim 1, wherein a distance from said first gate electrode to an end of said first semiconductor region is shorter than a distance from said second gate electrode to an end of said second semiconductor region.

6. The semiconductor device of claim 1, wherein said first MIS transistor and said second MIS transistor are designed to have an equivalent saturation current value.

7. The semiconductor device of claim 1, wherein said first MIS transistor and said second MIS transistor are N-type MIS transistors.

8. The semiconductor device of claim 1, wherein said first MIS transistor and said second MIS transistor are included in an SRAM.

9. A semiconductor device comprising:
a first MIS transistor and a second MIS transistor,
wherein said first MIS transistor includes:
  a first source/drain region formed in a first semiconductor region surrounded by an isolation region in a semiconductor substrate; and
  a first gate electrode formed on said first semiconductor region and having a first gate length and a first gate width,
said second MIS transistor includes:
  a second source/drain region formed in a second semiconductor region surrounded by said isolation region in said semiconductor substrate; and
  a second gate electrode formed on said second semiconductor region and having a second gate length and a second gate width,
said first gate electrode and said second gate electrode are formed integrally extending in a gate width direction, and connected with each other, thereby constituting a simile gate line,
said first gate length is shorter than said second gate length,
said first semiconductor region and said second semiconductor region are separated from each other by said isolation region, and sandwich said isolation region in the gate width direction, and
said first semiconductor region has a smaller width along a gate length direction than said second semiconductor region, wherein said first MIS transistor and said second MIS transistor are included in an SRAM, and wherein said first MIS transistor and said second MIS transistor are access transistors.

10. The semiconductor device of claim 9, wherein said first gate width and said second gate width are substantially equivalent.

11. The semiconductor device of claim 9, wherein said first MIS transistor further includes a first channel region formed below said first gate electrode in said first semiconductor region,
  said second MIS transistor further includes a second channel region formed below said second gate electrode in said second semiconductor region, and
  an impurity concentration is lower in said first channel region than in said second channel region.

12. The semiconductor device of claim 9, wherein a distance from said first gate electrode to an end of said first semiconductor region is shorter than a distance from said second gate electrode to an end of said second semiconductor region.

13. The semiconductor device of claim 9, wherein said first MIS transistor and said second MIS transistor are designed to have an equivalent saturation current value.

14. The semiconductor device of claim 9, wherein said first MIS transistor and said second MIS transistor are N-type MIS transistors.

15. The semiconductor device of claim 9, wherein said first MIS transistor and said second MIS transistor are included in an SRAM.

16. A semiconductor device comprising:
a first MIS transistor and a second MIS transistor,
wherein said first MIS transistor includes:
  a first source/drain region formed in a first semiconductor region surrounded by an isolation region in a semiconductor substrate;
  a first gate electrode formed on said first semiconductor region and having a first gate length and a first gate width; and
  a first channel region formed below said first gate electrode in said first semiconductor region,
said second MIS transistor includes:
  a second source/drain region formed in a second semiconductor region surrounded by said isolation region in said semiconductor substrate;

a second gate electrode formed on said second semiconductor region and having a second gate length and a second gate width; and a second channel region formed below said second gate electrode in said second semiconductor region, said first gate electrode and said second gate electrode are formed integrally extending in a gate width direction, and connected with each other, thereby constituting a single gate line, said first semiconductor region has a smaller width along a gate length direction than said second semiconductor region, said first semiconductor region and said second semiconductor region are separated from each other by said isolation region, and sandwich said isolation region in the gate width direction, and an impurity concentration is lower in said first channel region than in said second channel region, wherein said first MIS transistor and said second MIS transistor are included in an SRAM, and wherein said first MIS transistor and said second MIS transistor are access transistors.

17. The semiconductor device of claim 16, wherein said first gate width and said second gate width are substantially equivalent, and
said first gate length and said second gate length are substantially equivalent.

18. The semiconductor device of claim 16, wherein a distance from said first gate electrode to an end of said first semiconductor region is shorter than a distance from said second gate electrode to an end of said second semiconductor region.

19. The semiconductor device of claim 16, wherein said first MIS transistor and said second MIS transistor are designed to have an equivalent saturation current value.

20. The semiconductor device of claim 16, wherein said first MIS transistor and said second MIS transistor N-type MIS transistors.

* * * * *